US011105856B2

(12) United States Patent
Ray et al.

(10) Patent No.: US 11,105,856 B2
(45) Date of Patent: Aug. 31, 2021

(54) DETECTION OF PERFORMANCE DEGRADATION IN INTEGRATED CIRCUITS

(71) Applicant: International Business Machines Corporation, Armonk, NY (US)

(72) Inventors: Emily A. Ray, Hastings on Hudson, NY (US); Emmanuel Yashchin, Yorktown Heights, NY (US); Peilin Song, Lagrangeville, NY (US); Kevin G. Stawiasz, Bethel, CT (US); Barry Linder, Hastings-on-Hudson, NY (US); Alan Weger, Mohegan Lake, NY (US); Keith A. Jenkins, New York, NY (US); Raphael P. Robertazzi, Ossining, NY (US); Franco Stellari, Waldwick, NJ (US); James Stathis, Poughquag, NY (US)

(73) Assignee: International Business Machines Corporation, Armonk, NY (US)

( * ) Notice: Subject to any disclaimer, the term of this patent is extended or adjusted under 35 U.S.C. 154(b) by 465 days.

(21) Appl. No.: 16/189,295

(22) Filed: Nov. 13, 2018

(65) Prior Publication Data
US 2020/0150181 A1  May 14, 2020

(51) Int. Cl.
*G06F 11/22* (2006.01)
*G01R 31/3193* (2006.01)
*G01R 31/319* (2006.01)

(52) U.S. Cl.
CPC .. *G01R 31/31932* (2013.01); *G01R 31/31915* (2013.01)

(58) Field of Classification Search
USPC .......................................... 716/136; 702/186
See application file for complete search history.

(56) References Cited

U.S. PATENT DOCUMENTS

| 5,675,546 | A | 10/1997 | Leung |
| 6,502,212 | B1* | 12/2002 | Coyle .................. G06F 11/221 710/15 |
| 7,711,524 | B2 | 5/2010 | Johri et al. |
| 7,821,280 | B2 | 10/2010 | Burns et al. |

(Continued)

OTHER PUBLICATIONS

Hamada, M., et al., "A high-speed boundary search Shmoo plot for ULSI memories", 1993 IEEE International Workshop on Memory Testing, Aug. 9-10, 1993, pp. 4-9.

*Primary Examiner* — Brian Ngo
(74) *Attorney, Agent, or Firm* — Scully, Scott, Murphy & Presser, P.C.; Daniel P. Morris

(57) ABSTRACT

Methods and systems of detecting chip degradation are described. A processor may execute a test on a device at a first time, where the test includes executable instructions for the device to execute a task under specific conditions relating to a performance attribute. The processor may receive performance data indicating a set of outcomes from the task executed by the device during the test. The processor may determine a first value of a parameter of the performance attribute based on the identified subset. The processor may compare the first value with a second value of the parameter of the performance attribute. The second value is based on an execution of the test on the device at a second time. The processor may determine a degradation status of the device based on the comparison of the first value with the second value.

20 Claims, 7 Drawing Sheets

(56) References Cited

U.S. PATENT DOCUMENTS

| | | |
|---|---|---|
| 8,020,138 B2 | 9/2011 | Balch et al. |
| 8,390,313 B2 | 3/2013 | Ikenaga et al. |
| 9,298,651 B2 | 3/2016 | Heyrman et al. |
| 9,310,426 B2 | 4/2016 | Anemikos et al. |
| 2003/0120451 A1 | 6/2003 | Thatcher et al. |
| 2010/0332373 A1* | 12/2010 | Crabtree ............... G06Q 40/04 705/37 |
| 2015/0347261 A1* | 12/2015 | Li ...................... G06F 11/3006 707/602 |
| 2016/0231379 A1 | 8/2016 | Charlebois et al. |
| 2017/0242066 A1 | 8/2017 | Aipperspach et al. |
| 2018/0067535 A1 | 3/2018 | Kosonocky et al. |

* cited by examiner

DETECTION OF PERFORMANCE DEGRADATION IN INTEGRATED CIRCUITS

STATEMENT REGARDING FEDERALLY SPONSORED RESEARCH OR DEVELOPMENT

This invention was made with Government support under Contract No.: HR0011-11-C-0060 awarded by Defense Advanced Research Projects Agency (DARPA). The Government has certain rights in this invention.

BACKGROUND

The present application relates generally to computers, and computer applications, and more particularly to computer-implemented methods and systems relating to degradation detection in hardware devices.

In some examples, semiconductor chips may be monitored and tracked for degradation, which may involve using on-chip sensors and performing statistical analysis on large batches of chips. In the technical field of chip performance tracking and monitoring, a metric or parameter to describe task-based performance of a chip is lacking. Further, the variation of the performance of a chip, as the chip approaches an end of its lifespan, is typically very small due to the critical pathways (e.g., the path between an input and an output with maximum latency) of the chip. Thus, high resolution and prevision for performance measurements and associated boundaries are needed and may be beneficial to degradation detection.

SUMMARY

In some examples, a method of component degradation detection is generally described. The method may include executing a test on a device at a first time. The test may include executable instructions for the device to execute a task under at least one specific condition, and the at least one specific condition may include a range of attribute values of a performance attribute. The method may further include receiving performance data indicating a set of outcomes from the task executed by the device during the test. Each outcome may correspond to an attribute value of the performance attribute. The method may further include transforming the performance data into a set of test results. The method may further include identifying a subset of the test results based on a baseline attribute value. The method may further include determining a first value of a parameter of the performance attribute of the device based on the identified subset. The method may further include comparing the first value with a second value of the parameter of the performance attribute. The second value may be based on an execution of the test on the device at a second time. The method may further include determining a degradation status of the device based on the comparison of the first value with the second value of the parameter of the performance attribute.

In some examples, a system of component degradation detection is generally described. The system may include a memory device and a hardware processor configured to be in communication with the memory device. The hardware processor may be configured to execute a test on a device at a first time. The test may include executable instructions for the device to execute a task under at least one specific condition, and the at least one specific condition may include a range of attribute values of a performance attribute. The hardware processor may be further configured to receive performance data indicating a set of outcomes from the task executed by the device during the test. Each outcome may correspond to an attribute value of the performance attribute. The hardware processor may be further configured to transform the performance data into a set of test results. The hardware processor may be further configured to identify a subset of the test results based on a baseline attribute value. The hardware processor may be further configured to determine a first value of a parameter of the performance attribute based on the identified subset. The hardware processor may be further configured to compare the first value with a second value of the parameter of the performance attribute. The second value may be based on an execution of the test on the device at a second time. The hardware processor may be further configured to determine a degradation status of the device based on the comparison of the first value with the second value.

In some examples, a computer program product of component degradation detection is generally described. The computer program product may include a computer readable storage medium having program instructions embodied therewith. The program instructions may be executable by a processing element of a device to cause the device to perform one or more methods described herein.

Further features as well as the structure and operation of various embodiments are described in detail below with reference to the accompanying drawings. In the drawings, like reference numbers indicate identical or functionally similar elements.

DETAILED DESCRIPTION

Figure 1:
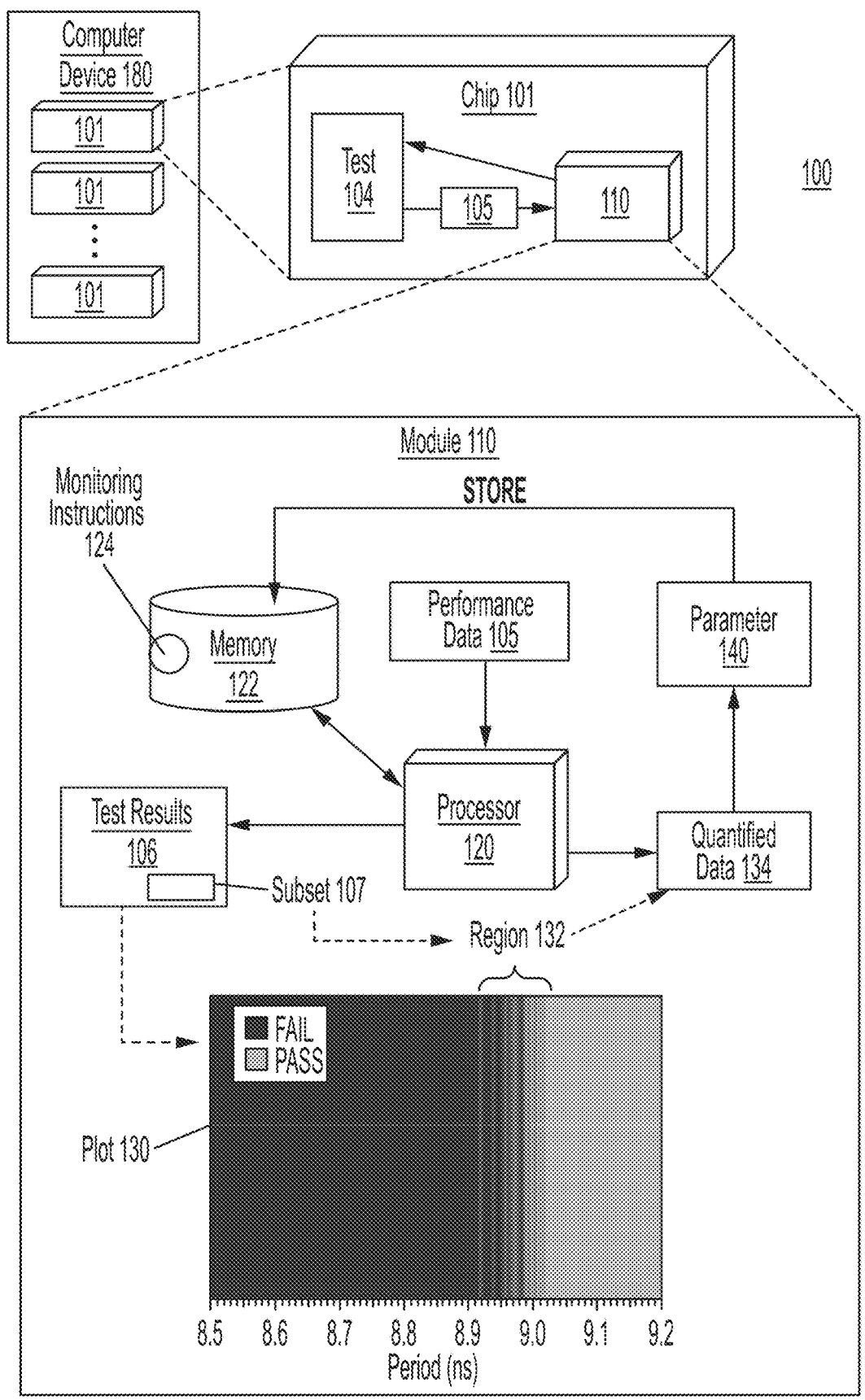
FIG. 1 illustrates an example computer system, in one embodiment, that can be utilized to implement detection of performance degradation in integrated circuits.

A system (e.g., system 100) in accordance with the present disclosure is implemented to define an attribute parameter that characterizes a particular performance attribute of a semiconductor chip under specific operating conditions (e.g., physical environment, task assignments, and/or other conditions). The system 100 monitors and tracks the defined attribute parameter over time, in order to analyze changes in the performance attribute characterized by the defined attribute parameter. To be described in more detail below, the system 100 determines different values of the attribute parameter periodically over a range of times, and performs an analysis on the determined values over the range of times, in order to determine a course of actions that may optimize a lifespan of the chip. For example, the system 100 may determine a first value of an attribute parameter, that characterizes a performance attribute of the chip, at a first time by assigning a set of tasks to the chip at the first time, and may determine a second value of the attribute parameter at a second time by assigning the same set of tasks to the chip at the second time. The system 100 may continue to determine subsequent values of the attribute parameter at subsequent times, and perform an analysis on the determined values of the attribute parameter, such as determining a rate of change of the attribute parameter over time. By analyzing the rate of change of the attribute parameter over time, the system 100 may determine an effect of the execution of the set of tasks on the performance attribute, characterized by the attribute parameter, of the chip, and may determine whether the chip shall be assigned to perform the set of tasks, be assigned to a different set of tasks, be replaced, and/or other actions that may optimize the lifespan of the chip.

In another example, the system 100 may determine a first set of values of an attribute parameter characterizing a performance attribute of a first chip by assigning a set of tasks to the first chip, and may determine a second set of values of the same attribute parameter associated with a second chip by assigning the same set of tasks to the second chip. The system 100 may analyze changes of each of the first and second sets of values over time, such as comparing a rate of change of the first set of values with a rate of change of the second set of values. Based on the analysis, if the first set of values approaches a degradation threshold faster than the second set of parameters, then the system 100 may determine that the first chip is degrading faster than the second chip. The system 100 may assign the set of tasks to the second chip instead of the first chip to optimize the lifespan of the first chip. Thus, the system 100 may improve a computer device including a plurality of semiconductor chips by analyzing values of attribute parameters characterizing the effects of different computing tasks on different performance attributes of the chips in order to determine and perform appropriate actions to optimize the lifespan of each chip in the computer device. Further, the system 100 may improve the computer device by conducting periodic tests on the chips of the computer device, in addition to, or instead of, installing various sensors to detect degradation of the chips in the computer device.

FIG. 1 illustrates an example computer system, in one embodiment, that can be utilized to implement detection of performance degradation in integrated circuits, arranged in accordance with at least some embodiments described herein. In some examples, the system 100 is implemented with a module 110, where the module 110 may be integrated, embedded, or disposed, on a chip 101. The module 110 may be configured to be in communication with one or more components or circuits of the chip 101. The chip 101 may be an integrated circuit including a set of electronic circuits composed of transistors. In some examples, the chip 101 may be a chip among a plurality of chips of a computer device, and each chip of the computer device may be configured to be in communication with a respective module 110. The module 110 may be a hardware module or a software module. In examples where the module 110 is a hardware module, the module 110 may be a set of circuits and/or components arranged in a specific layout to perform the methods in accordance with the present disclosure. In examples where the module is a software module, the module 110 may include circuits and/or components of the chip 101 that are programmed to perform the methods in accordance with the present disclosure.

The module 110 may include a processor 120 and a memory 122 configured to be in communication with each other. In some examples, the processor 120 may be a microcontroller, a microprocessor, or other types of special purpose processors. In some examples, the processor 120 and the memory 122 may be components of the chip 101, or components of the computer device housing the chip 101. In some examples, the module 110 may be controlled by a central processing unit of the computer device that houses the chip 101. In some examples, the chip 101 and/or the module 110 may include additional hardware components that may be configured to perform respective tasks of the methods described in the present disclosure.

In some examples, the processor 120 may be configured to execute instructions stored in the memory 122 to perform the methods described in the present disclosure. For example, the memory 122 is configured to selectively store a set of monitoring instructions 124 ("instructions 124"), where the instructions 124 may include instructions, such as executable code, related to logic operations, graphics processing, statistics analysis, and/or other algorithms or techniques, which may implement the system 100. The processor 120 is configured to execute one or more portions of the instructions 124 in order to facilitate implementation of the system 100. In some examples, the module 110 may be packaged as a standalone application that may be installed on the chip 101 or the computer device housing the chip 101 to implement the system 100.

During operations of the chip 101, the module 110 may execute, or conduct, a test 104 on the chip 101. The test 104 may assign one or more tasks to the chip 101. For example, the test 104 may include executable instructions for the chip 101 to execute the one or more tasks under at least one specific requirement, condition, and/or constraint. The test 104 may also indicate a performance attribute to be tested on the chip 101, such as operating period, voltage, memory usage, frequency, current flow, and/or other performance attributes. In examples where the test 104 may be a stress test, the test 104 may include disposing the chip in particular physical conditions, such as physical environments of different temperature settings. The chip 101 may perform the executable instructions of the test 104 to perform the one or more tasks, and the results of the tasks, labeled as performance data 105, may be collected by the module 110. The module 110 may classify the performance data 105 into test results 106, where the test results 106 may indicate different types of test results, such as whether the chip 101 passed or failed the tasks of the test 104.

For example, the chip 101 may be configured to operate at a 9.00 nanosecond (ns) period, such that the module 110 may set a baseline operating period at 9.00 ns. In some examples, the baseline operating period may be based on historical data and previous test results (further described below). The module 110 may conduct the test 104 on the chip 101, where the test 104 may include executable instructions for the chip 101 to perform N floating point divisions. The test 104 may indicate a range of attribute values, such as operating periods, in order for the chip 101 to attempt to perform the N floating point divisions at a plurality of operating periods lower and higher than the baseline operating period of 9.00 ns. For example, the chip 101 may attempt to perform the N floating point divisions from an operating period of 8.50 ns up to 9.50 ns, at increments of 0.01 ns, such that the performance data 105 may include one-hundred pieces of performance data. The performance data 105 may indicate outcomes or completion status of the tasks assigned by the test 104, such as a number of floating point divisions that are successfully completed by the chip 101 at each operating period. The module 110 may collect the performance data 105 and may classify each piece of performance data 105 as passing or failing the test 104. For example, the performance data 105 may indicate that the chip 101 successfully completed less than N floating point divisions at an operating period of 8.9 ns, and the chip 101 successfully completed the N floating point divisions at an operating period of 9.1 ns. Thus, the module 110 may classify the performance data at 8.9 ns as a failed test result, and may classify the performance data at 9.1 ns as a passed or successful test result. In some examples, the range of attribute values (e.g., operating periods) to execute the test 104 may be based on the tasks indicated by the test 104, a baseline attribute value, the properties of the chip 101, the age of the chip 101, and/or other factors.

In some examples, the module 110 may generate a plot 130 to represent the test results 106. The plot 130 may be a visual representation of the test results 106 and may resemble a shmoo plot, or in some examples, a portion of a shmoo plot. As shown in the plot 130, the test results 106 may indicate how the chip 101 transition from failed test results into successful test results over the plurality of operating periods. For example, at 8.9 ns, the chip 101 could not successfully complete N floating point divisions in time, but as the operating period increases, the rate of success of the chip 101 performing the N floating point divisions also increase.

The processor 120 may identify a subset 107 of the test results 106, where the subset 107 includes a plurality of test results transitioning from failed test results to successful test results. The subset 107 may span from a last failed result prior to a first passed result, to a first passed result subsequent to a last failed result among the test results 106. In an example embodiment, the module 110 may perform an iterative search on the test results 106 starting from the test result at 8.5 ns, to identify the last failed result prior to the first passed result, and to identify the first passed result subsequent to the last failed result. In another example embodiment, the module 110 may use the plot 130, such as by executing image processing algorithms to identify edges or difference in visual attribute of the plot 130, to identify a region 132 that corresponds to the subset 107. In some examples, by utilizing the plot 130, the module 110 may avoid performing the iterative search mentioned above to avoid performing exhaustive computations to search for the subset 107 among the test results 106. The module 110 may select whether to identify the subset 107 using the iterative search approach, or the image processing approach based on plot 130, depending on factors such as a size of the test result 106, preferences set by administrators of the system 100, available processing power and memory allocated to implement the module 110, and/or other factors.

Upon identifying the subset 107, the module 110 may quantify or enumerate each test result among the subset 107 to generate quantified data 134, such that each test result among the subset 107 may be quantified to a numerical value. In an example where the subset 107 is quantified to binary values, a failed test result is enumerated to a value of '0' and a successful test result is enumerated to a value of '1', such that the quantified data 134 may include a data stream of binary values '0' and '1'. A different enumeration may be employed, for example, a value of '1' to represent a failed test result and a value of '0' to indicate a successful test result. To be described in more detail below, the module 110 may determine a value of an attribute parameter 140 ("parameter 140") from the quantified data 134, and may store the determined value in the memory 122. The parameter 140 may define a boundary between failing and passing results of the test 104 performed by the chip 101, and the parameter 140 may be a variable such that each execution of the test 104 on the chip 101 may result in a different value of the parameter 140. Each value of the parameter 140 is an attribute value (e.g., among the range of attribute values indicated by the test 104) in which a minimum cumulative sum of a set of deviations associated with the quantified data 134 occurs (further described below). The module 110 may execute the test 104 on the chip 101 at a later time to determine a new value of the parameter 140, and may store the new value in the memory 122. The module 110 may continue to periodically execute the test 104 on the chip 101 and to store values of the parameter 140 determined from each execution of the test 104 in the memory 122. In some examples, the module 110 may set a newly determined value of the parameter 140, or an average of previously determined values of the parameter 140, as a next baseline attribute value for a subsequent execution of the test 104. For example, in a first test, the baseline operating period is 9.0 ns, but after twenty tests, an average of the twenty determined values of the parameter 140 may be 9.1 ns, and a new baseline attribute value for a next execution of the test 104 may be set to 9.1 ns.

In some examples, the module 110 may further determine other properties of the determined values of the parameter 140, such as the mean, standard deviation, median, and/or other attributes of the parameters, and may store the properties in the memory 122 for future analysis. For example, the module 110 may determine and store (in the memory 122), for each value, a deviation of the value from a baseline attribute value that is considered as acceptable, a deviation from the baseline attribute value that is considered as unacceptable, a mean of all the baseline attribute values, and/or other properties. Based on the stored properties, the module 110 may set various new criteria for the test 104, such as defining an acceptable deviation at +5%, defining an unacceptable deviation at +10%, setting a false alarm probability to be 0.001, and defining a requirement that the deviation of +10% be detected within 2 months, and/or other criteria for subsequent execution of the test 104.

In an example, as each new value of the parameter 140 characterizing a performance attribute is determined, the module 110 may compare the newly determined values with one or more previously determined values of the parameter to determine a rate of change. If the rate of change exceeds a threshold, the module 110 may determine that the chip 101 shall no longer perform the tasks indicated by the test 104. For example, if the test 104 indicates the task of floating point division, the module 110 may determine that the chip 101 shall not be assigned to perform floating point divisions due to a rate of change of the parameter 140 exceeding the threshold, which indicates that the chip 101 potentially ages at a rate faster than an expected rate when the chip 101 is assigned to perform floating point divisions.

In another example, as each new value of the parameter characterizing a performance attribute is determined, the module 110 may compare the newly determined value with a historical value of the parameter that was set as a critical value indicating the chip 101 is nearing an end of life. For example, a model of the chip 101 is known to malfunction if the chip 101 fails to successfully complete the N floating point divisions at an operating period of 9.3 ns. The module 110 may determine a difference between the newly determined value with 9.3 ns, and if the difference is less than the threshold (the newly determined value is in proximity with the critical value of 9.3 ns), the module 110 may determine that the chip 101 may need to be replaced, or shall not be assigned to perform floating point divisions.

Figure 2:
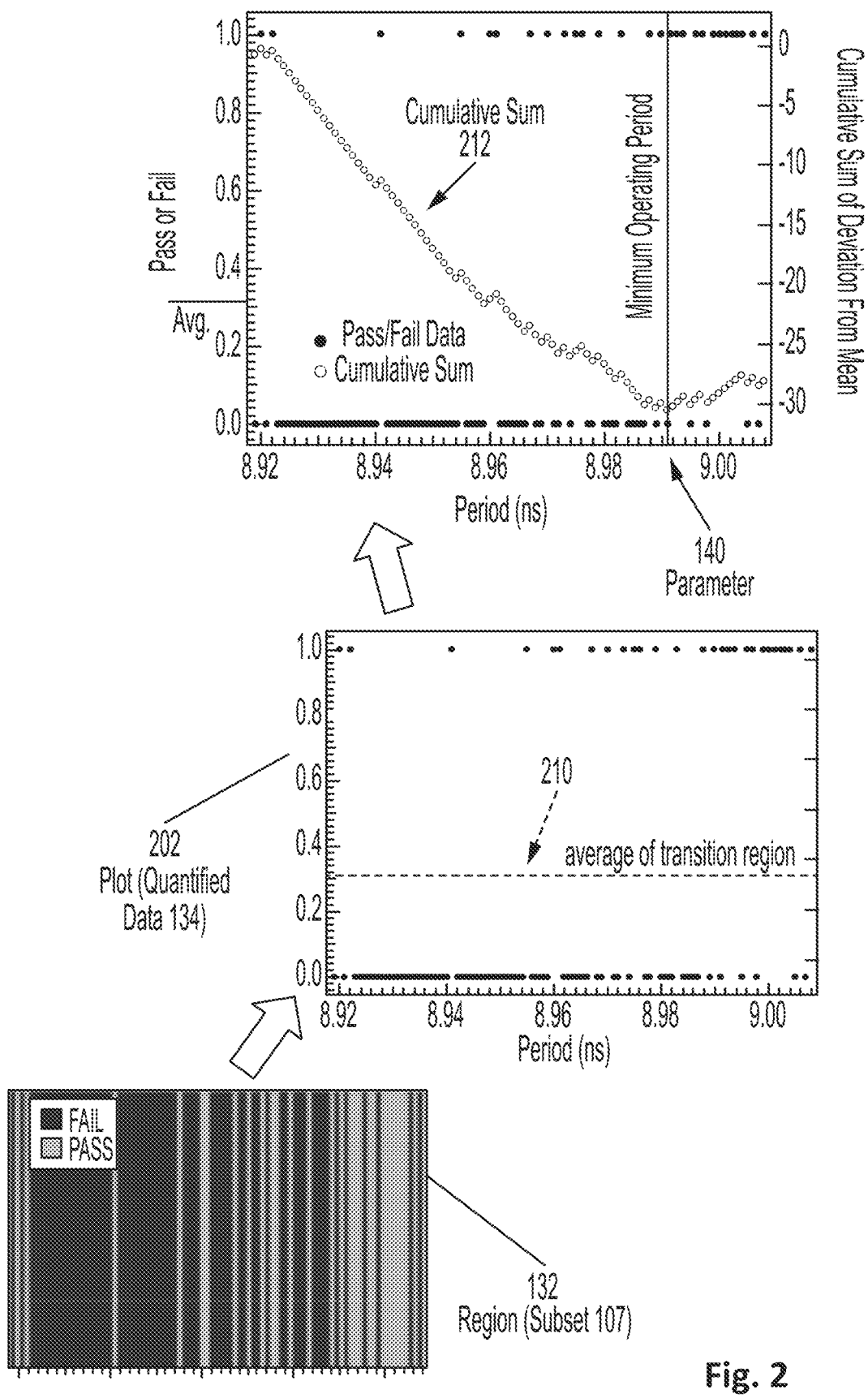
FIG. 2 illustrates example results from an implementation of the example computer system of FIG. 1 in one embodiment.

FIG. 2 illustrates example results from an implementation of the example computer system of FIG. 1 in one embodiment, arranged in accordance with at least some embodiments presented herein. FIG. 2 may include components that are labeled identically to components of FIG. 1, which will not be described again for the purposes of clarity. The description of FIG. 2 may reference at least some of the components of FIG. 1.

In an example shown in FIG. 2, a plot 202 may represent the quantified data 134 when the test results among the subset 107 are quantified into binary values '0' and '1'. The module 110 may determine a target switch-over level 210 of the quantified data 134. In examples where the quantified data 134 include binary values, the target switch-over level 210 may be an average of the quantified data 134. In other examples where the quantified data 134 includes numerical values that are not binary, the target switch-over level 210 may be defined in instructions 124, and may be based on historical values of attribute values (e.g., values of operating periods, frequencies, voltages) used by the chip 101, product design characteristics of the chip 101, desired implementation of the system 100, and/or other factors. Further details on the determination of the target switch-over level 210 will be provided below.

The module 110 may determine a set of deviations, where each deviation is a deviation of a piece of quantified data (among quantified data 134) from the target switch-over level 210. The module 110 may apply a cumulative sum technique on the set of deviations to determine a set of cumulative sum 212, where each cumulative sum corresponds to an attribute value indicate by the test 104 (e.g., in the example shown in FIG. 2, the performance attribute is operating period, and the attribute values range from, approximately, 8.9 ns to 9.08 ns). The module 110 may identify a minimum value of the cumulative sum 212 and may set the attribute value corresponding to the identified minimum value as the value of the parameter 140 for this particular execution of test 104. In the example shown in FIG. 2, the attribute value corresponding to the minimum of the cumulative sum 212 is approximately 8.99 ns, and thus the value of the parameter 140 is set as 8.99 ns. Further details of the determination of the cumulative sum 212 will be provided below.

Figure 3:
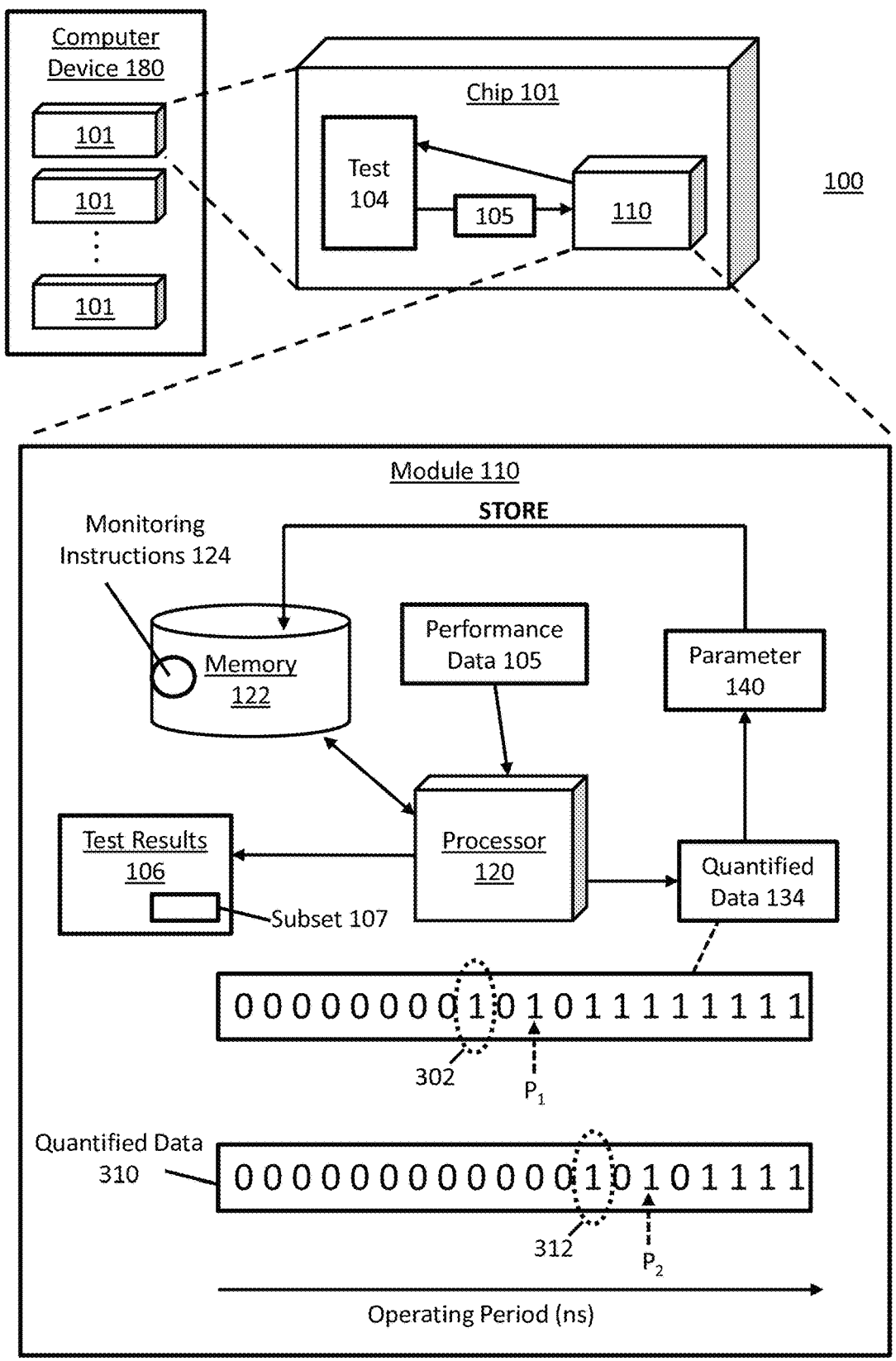
FIG. 3 illustrates the example computer system of FIG. 1, in one embodiment, with additional details relating to detection of performance degradation in integrated circuits.

FIG. 3 illustrates the example computer system of FIG. 1, in one embodiment, with additional details relating to detection of performance degradation in integrated circuits, arranged in accordance with at least some embodiments presented herein. FIG. 3 may include components that are labeled identically to components of FIGS. 1-2, which will not be described again for the purposes of clarity. The description of FIG. 3 may reference at least some of the components of FIGS. 1-2.

In an example shown in FIG. 3, the module 110 may execute the test 104 at a first time $t_1$ to determine the test results 106 and the quantified data 134. The quantified data 134 may include a data stream of binary values, where a first successful test result among the test results 106 is indicated as quantified test result 302. The module 110 may conduct the test 104 at a second time $t_2$, where the second time $t_2$ is a time later than the first time $t_1$, to determine new test results and quantified data 310. The quantified data 310 may include a data stream of binary values, where a first successful test result among the new test results is indicated as quantified test result 312. As shown in the example of FIG. 3, a number of failed test results before a first success (e.g., the amount of '0' before a first '1') at the first time $t_1$ is less than a number of failed test results before a first success at the second time $t_2$. The difference between the number of failed results before a first success at the first time $t_1$ and at the second time $t_2$ may indicate that the chip 101 may be degrading or aging. In other words, at the second time $t_2$, the chip 101 may need to operate at periods greater than the operating periods at the first time $t_1$ to perform the same tasks assigned by the test 104. Further, a first value $P_1$ of the parameter 140 determined at $t_1$ is less than a second value $P_2$ of the parameter 140 determined at $t_2$, which indicates that the operating period used by the chip 101 is increasing over time, and the increase of the values of the parameter 140 associated with the operating period is indicative of a degradation of the chip 101. In some examples, the determination of the degradation of the chip 101 may be based on more than one level of comparisons. For example, even if the number of failures prior to the first success at $t_1$ is less than the number of failed test results before a first success at the second time $t_2$, the module 110 may still perform the comparison of $P_1$ and $P_2$ to determine whether the chip 101 is degrading.

Figure 4:
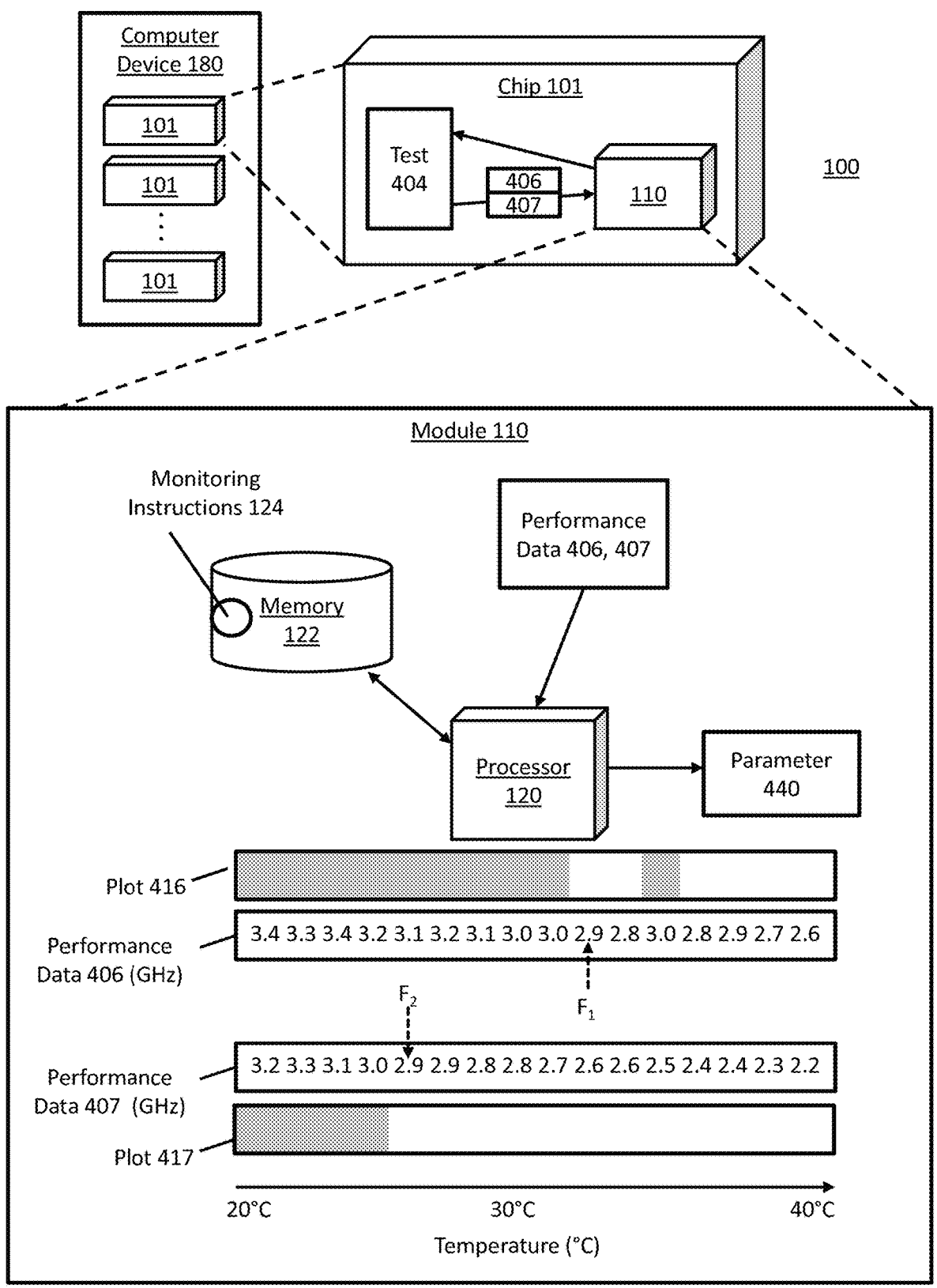
FIG. 4 illustrates the example computer system of FIG. 1, in one embodiment, with additional details relating to detection of performance degradation in integrated circuits.

FIG. 4 illustrates the example computer system of FIG. 1, in one embodiment, with additional details relating to detection of performance degradation in integrated circuits, arranged in accordance with at least some embodiments presented herein. FIG. 4 may include components that are labeled identically to components of FIGS. 1-3, which will not be described again for the purposes of clarity. The description of FIG. 4 may reference at least some of the components of FIGS. 1-3.

In an example shown in FIG. 4, the module 110 may execute a test 404 on the chip 101 to determine values of a parameter 440 characterizing a temperature performance of the chip 101 when the chip 101 is operating under different temperatures, such as a range of temperatures from 20° C. to 40° C., with an increment of 1° C. Thus, in the example shown in FIG. 4, the performance attribute to be tested is the temperature of the chip 101, the range of attribute values is 20° C. to 40° C., the performance data from the test 404 are operating frequencies. The example in FIG. 4 corresponds to an embodiment where the quantified data, described above, are not binary values, and the quantified data may be identical to performance data received from the chip 101 as a result of execution of the test 404. The performance data 406, expressed in gigahertz (GHz), are results from an execution of the test 404 at a first time, and the performance data 407, expressed in gigahertz (GHz), are results from an execution of the test 404 executed at a second time. At the first time, the module 110 may determine a first target switch-over level of performance data 406 and may determine a first set of deviations of the performance data 406 from the first target switch-over level. The module 110 may determine a value $F_1$ of the parameter 440 by identifying a temperature that corresponds to a minimum of a cumulative sum of the first set of deviations. Similarly, at the second time, the module 110 may determine a second target switch-over level of performance data 407 and may determine a second set of deviations of the performance data 407 from the second target switch-over level. The module 110 may determine a value $F_2$ of the parameter 440 by identifying a temperature that corresponds to a minimum of a cumulative sum of the second set of deviations. In the example shown in FIG. 4, as the temperature increases, the operating frequency of the chip 101 may decrease. Based on a comparison of the values $F_1$ and $F_2$, the module 110 may determine that $F_2$ is a temperature lower than $F_1$, which may indicate that at the second time, the operating frequency of the chip 101 starts to decline earlier, or at lower temperatures, during the test 404. Thus, the module 110 may determine that the chip 101 is degrading and may avoid running the chip 101 under conditions of high temperatures.

In an example, the module 110 may generate plots (e.g., shmoo plots) 416, 417, for performance data 406, 407, respectively. The module 110 may classify the performance data 406, 407 into binary test results, such as being acceptable if an operating frequency is above or equal to 3.0 GHz, or being unacceptable if an operating frequency is below 3.0 GHz. As shown in the plots 416, 417, the shaded portions correspond to acceptable operating frequencies and the unshaded portions correspond to unacceptable operating frequencies. The plots 416, 417 may be used by the module 110 to perform the analysis in accordance with the methods described in the present disclosure, similar to plot 130 illustrated in FIG. 1 and described above. For example, the module 110 may quantify the shaded and unshaded portions of the plots 416 and 417 into binary values (similar to quantified data 134 described above) in order to determine values of the parameter 440.

In an example, the attribute values being analyzed (e.g., a range of operating periods to execute the test 104) may be represented as a sequence of monotonic inputs $\{x_i\}=\{x_1, x_2, \ldots, x_n\}$. The sequence $\{x_i\}$ may be monotonically increasing for performance attributes characterized by a parameter that increases with degradation (e.g., higher operating periods means a chip is taking longer to run and thus degrading). The sequence $\{x_i\}$ may be monotonically decreasing for performance attributes characterized by a parameter that decreases with degradation (e.g., lower operating frequencies means a chip is running slower and thus degrading). In the example shown in FIG. 3, the input sequence $\{x_i\}$ may be the range of operating frequencies, and in the example shown in FIG. 4, the input sequence $\{x_i\}$ may be the range of temperatures.

The quantified data 134, such as pass or fail, success or fail, acceptable or unacceptable, or '0' or '1', may be denoted as a sequence of outputs, or observed variables, $\{y_i\}=\{y_1, y_2, \ldots, y_n\}$, which may also be monotonic. For example, in examples where the parameter 140 is associated with operating periods and the sequence $\{y_i\}$ may include binary numbers, the quantified data 134 may be monotonically increasing from a series of zeroes to a series of ones, as shown in the plot 130 and the examples in FIG. 3. In the example shown in FIG. 4, the output sequence $\{y_i\}$ may be the performance data expressed as operating frequencies if the implementation of the system 100 does not quantify the performance data 406 or 407 into binary values. If the implementation of the system 100 includes quantifying performance data into binary values, the output sequence $\{y_i\}$ may be binary values represent the shaded and unshaded portions of the plots 416 and 417. In some examples, the monotonic property of the sequence $\{y_i\}$ may be affected by noise factors (as shown in region 132). For a monotonically increasing sequence $\{x_i\}$, the sequence $\{y_i\}$ also monotonically increases and higher values in $\{y_i\}$ may indicate successful performance, and the lower values in $\{y_i\}$ may indicate poor or failed performance. In examples where the sequence $\{y_i\}$ is monotonically decreasing (e.g., for tests on operating frequencies), the sequence $\{x_i\}$ may be reversed to conform to the conditions of high $y_i$ values being successes and low $y_i$ values being failures. The module 110 may classify the performance data 105 (in FIG. 1) into test results 106 by transforming the performance data 105 corresponding to the inputs $\{x_i\}$ into the sequence $\{y_i\}$ based on rules, conditions, and/or constraints that may be defined in the instructions 124. For example, in the example where the parameter 140 is associated with operating periods, the module 110 may classify a piece of performance data corresponding to the input $x_{9.0}$ into $y_{9.0}$ based on whether the chip 101 successfully completed the N floating point divisions within the operating period of 9.0 ns.

The module 110 may determine the target switch-over level 210 (FIG. 2), denoted as k, from the quantified data 134. In examples where the quantified data 134 includes a data stream of binary values, the module 110 may determine k by determining an average of the quantified data 134. For example, in the example shown in FIG. 1 and FIG. 2, a value of k is 0.31. In other examples where the quantified data 134 may not be binary values (e.g., example in FIG. 4), a value of k may be defined based on a desired implementation of the system 100, historical performance of the chip 101, and/or other factors. For example, in the example shown in FIG. 4, historical performance of the chip 101 may indicate that an operating frequency above 3.0 GHz is acceptable and an operating frequency below 3.0 GHz is unacceptable. Thus, the module 110 may set k=3.0 GHz.

Using the above representations of sequences $\{x_i\}$ and $\{y_i\}$, and the target switch-over level k, the cumulative sum 212, denoted as $S_i$, may be determined using the following expression:

$$S_i = \sum_{m=1}^{i}(y_m - k), i = 1, 2, \ldots, n$$

The cumulative sum 212 is a cumulative sum of the deviations $(y_m-k)$ of each quantified test results $y_m$ from the target switch-over level k. The module 110 may identify a minimum value of the cumulative sum Si, denoted as $x_{i(0)}$, which corresponds to an index i(0), and may set the index i(0) as a value of the parameter 140 for the corresponding execution of test 104. Referring to the example in FIG. 1 and FIG. 2, a minimum of the cumulative sum 212 occurs at 8.99 ns, and thus, the value of the parameter 140 is set to 8.99 ns. In some examples, if a minimum of $S_i$ occurs at a relatively early index among indices i=1, 2 . . . , n, then the module 110 may determine an average of the indices prior to the minimum index i(0) and set the average as the value of parameter 140. For example, if n=100, and a minimum of $S_i$ occurs at the index i=5, then the module 110 may determine an average of the indices {1, 2, 3, 4, 5} to obtain an average of i=3, and set the index '3' as the parameter 140. The instructions 124 may define a threshold of a number of indices, such that the module 110 may compare the number of indices prior to the minimum index i(0) with the threshold in order to determine whether to determine an average of the indices.

Figure 5:
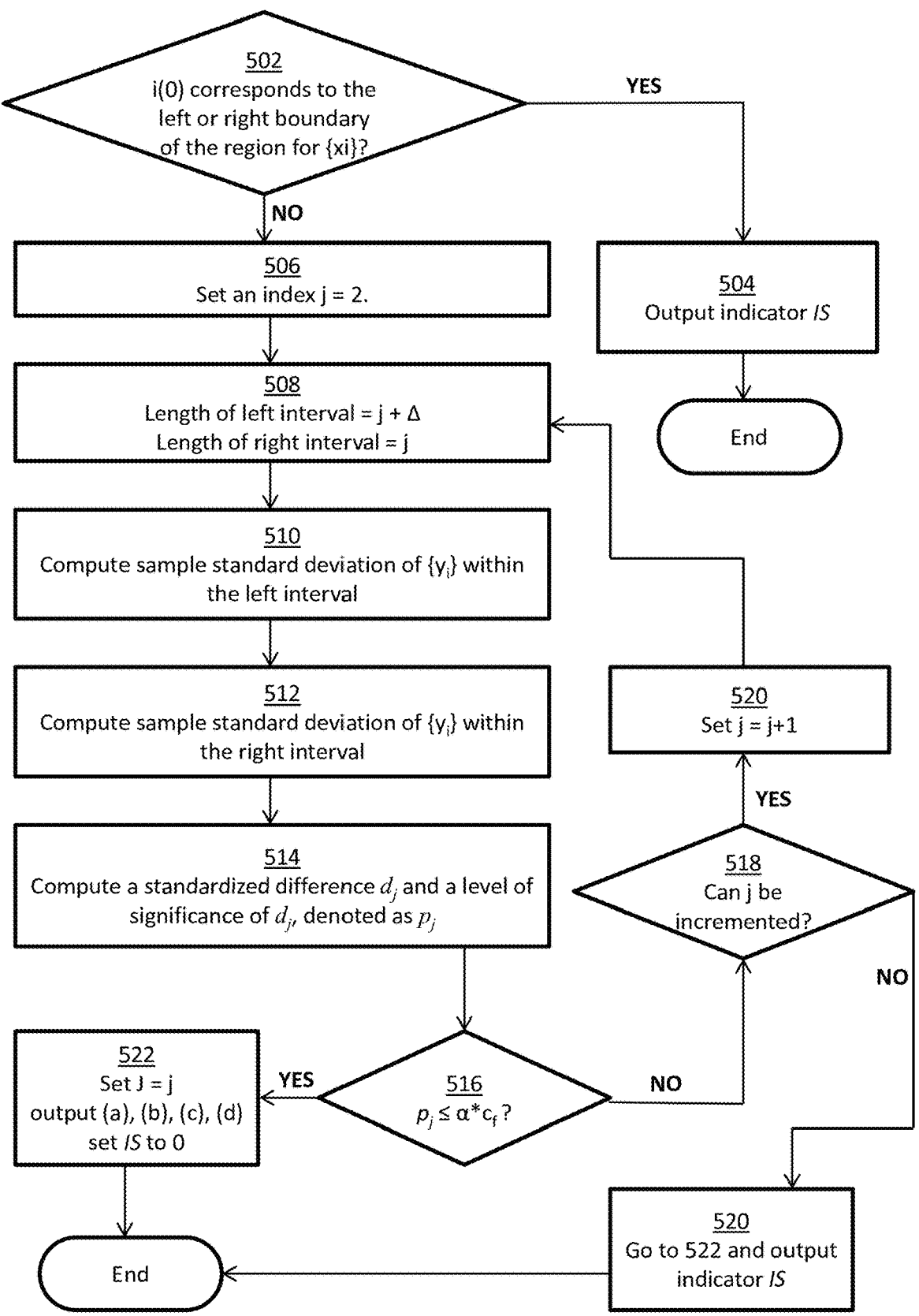
FIG. 5 illustrates a flow diagram relating to a process, in one embodiment, to implement detection of performance degradation in integrated circuits.

FIG. 5 illustrates a flow diagram relating to a process, in one embodiment, to implement detection of performance degradation in integrated circuits, arranged in accordance with at least some embodiments presented herein. The process in FIG. 5 may be implemented using, for example, system 100 discussed above. An example process may include one or more operations, actions, or functions as illustrated by one or more of blocks 502, 504, 506, 508, 510, 512, 514, 516, 518, 520, and/or 522. Although illustrated as discrete blocks, various blocks may be divided into additional blocks, combined into fewer blocks, eliminated, or performed in parallel, depending on the desired implementation.

In an example, the module may determine a plurality of values of the parameter 140 over time, and may determine a baseline value of the parameter 140 by, for example, determining an average of the determined values of the parameter 140. As time progresses, the baseline value may vary and (e.g., the average value of the parameter for a performance attribute) may start to shift towards one side of a test region (e.g., a range of indices), such as, a baseline operating period may shift to the "right side", or an increasing side, of the test region. For example, the test 104 is conducted for a range of operating periods from 8.8 ns to 9.2 ns, and after ten different tests, an average value of the parameters associated with operating period is 9.1 ns. As time progresses, for example, if the test 104 was conducted twenty more times, the average value of the parameter 140 may shift and exceed 9.2 ns, which is outside of the range 8.8 ns to 9.2 ns. Thus, after thirty instances of test 104 being conducted on the chip 101, it may no longer be reliable to conduct the test 104 on the range of 8.8 ns to 9.2 ns, and it may be likely that the baseline operating period no longer lies within the range of 8.8 ns to 9.2 ns after thirty executions of the test 104. In another example, as time progresses, the module 110 may determine that the baseline value is shifting within the test region relatively slow. For example, if the test 104 is conducted for a range of operating periods from 8.5 ns to 9.5 ns, and after ten different tests, an average value of the parameter 140 is 9.1 ns. As time progresses, for example, if the test 104 was conducted twenty more times, the average value of the parameter 140 is 9.12 ns, which is still within the test region but shifting at a low rate. Thus, after thirty instances of test 104 being conducted on the chip 101, it may not be efficient for the module 110 to analyze test results corresponding to the range of 8.5 ns to 9.5 ns and it may be beneficial to narrow the range of operating periods for the test 104 for future analysis. In some examples, the confidence region may be the region 132 corresponding to the subset 107 shown in FIG. 1.

In order to optimally analyze the changes in the values of the parameter 140, the module 110 may execute a confidence region algorithm to identify a confidence region, where the confidence region may be a range of indices, or a portion of the test region, that has a relatively high likelihood of including an index corresponding to the minimum value of the cumulative sum 212 (e.g., i(0)). By determining the confidence region, the module 110 may set an index within the confidence region as a baseline attribute value for a next execution of the test, such that the analyze to identify i(0) may be optimized (e.g., avoiding analysis on test results that may correspond to indices that are significantly far from i(0)). Further, various properties of the confidence region may be used as indicators of degradation. For example, an amount of shifting of the left and/or right bound of the confidence region over time may indicate a rate of change of the degradation of the chip. For example, a shift in the upper, or right, 95% confidence bound might indicate a change in degradation even if i(0) remains unchanged over time. Similarly, an increase in a width of the confidence region may indicate degradation related to performance variability, even if i(0) remains unchanged over time. Thus, the boundaries of the confidence region may be analyzed over time, in a similar way as i(0), to determine degradation of the chip 101. For example, analysis may be performed on changes to the boundaries of the confidence region at monthly intervals, and the pattern in which the boundaries change may reflect degradation of the chip 101.

The confidence region algorithm may be executed by the module 110 to identify the boundaries (indices) of the confidence region. In order to execute the confidence region algorithm, the following procedure constants are defined:

$\alpha$=Nominal significance level (typically around 0.05)
$c_f$=Coverage adjustment coefficient (typically around 0.1)
$\Delta$=skew adjustment (can be positive, negative or 0)

The nominal significance level a may affect a confidence score of the confidence region identified by the module. For example, when $\alpha$=0.05, the confidence region identified by the module 110 may have a confidence score of 95%, meaning that there is an estimated 95% chance that an average of the values (e.g., $x_{i(0)}$) among a plurality of tests) of the parameter will be within the determined confidence region. The coefficient $c_f$ may be a coefficient that determines a benchmark value of an amount of experimental expansion and/or shift of the current confidence region of the sequence $\{x_i\}$. The skew adjustment $\Delta$ may be a value associated with an experimental expansion and/or shift size (e.g., how far to expand the boundaries of the confidence region) of the current confidence region of the sequence$\{x_i\}$. For example, the execution of the confidence region algorithm may perform a set of instructions iteratively, where at each iteration, the module 110 will attempt to expand and/or shift the confidence region by an experimental amount (that is based on the skew adjustment $\Delta$), and the experimental amount may be compared with the benchmark value (that is based on the coefficient $c_f$) to determine whether it is possible to expand and/or shift the current confidence region by the experimental amount.

Referring to the process shown in FIG. 5, the confidence region algorithm may begin at block 502. At block 502, the module 110 may determine whether a previous identified index i(0) (value of the parameter 140), or a baseline value of the parameter 140, corresponds to the left or right boundary of the current test region including the sequence $\{x_i\}$. For example, if the sequence $\{x_i\}$ ranges from $x_1$ to $x_{20}$, and if i(0)=20, then the index i(0) corresponds to the right boundary of the current test region.

If the index i(0) corresponds to either the left or right boundary of the current test region, then the confidence region algorithm may proceed from block 502 to block 504. At block 504, the module 110 may output an indicator of success IS indicating which side (left or right) the index i(0) corresponds to, and proceed to exit the confidence region algorithm.

If the index i(0) does not corresponds to either the left or right boundary of the current test region, then the confidence region algorithm may proceed from block 502 to block 506. At block 506, the module 110 may set an index j to an initial value of 2. The index j may be used to experiment how far, or how many indices, can a current confidence region surrounding i(0) be expanded from the current value of i(0).

The confidence region algorithm may continue from block 506 to block 508. At block 508, the module 110 may set a length of the left interval that spans from the left boundary to i(0) (in terms of indices) to j+$\Delta$. The module 110 may further set a length of the right interval that spans from the right boundary to i(0) (in terms of indices) to j. For example, if i(0)= and $\Delta$=2, then the length of the left interval will be 4, such that the left interval includes the 4 indices prior to i(0), and the length of the right interval will be 2, such that the right interval includes 2 indices subsequent to i(0). In an example, when $\Delta$>0, the left boundary from i(0)

is further away from i(0) than the right boundary. When Δ<0, the right boundary from i(0) is further away from i(0) than the left boundary. When Δ=0, the left and right boundaries are symmetric around i(0). Thus, in order to achieve nominal coverage with short enough confidence interval around i(0), it may be beneficial to use non-zero Δ to control a degree of asymmetry of the left and right boundaries.

The confidence region algorithm may continue from block 508 to block 510. At block 510, the module 110 may determine sample standard deviations of $\{y_i\}$ corresponding to the indices within the left interval, where each standard deviation is denoted as $\hat{\sigma}_{L,j+\Delta}$, and where L indicates the standard deviations determined at block 510 corresponds to the left side from i(0). Further, the variance of $\{y_i\}$ within the left interval may be expressed as:

$$\hat{\sigma}^2_{L,j+\Delta} = \frac{1}{(j+\Delta)-1} \sum_{i=1}^{j+\Delta} [y_{i(0)-i+1} - \bar{y}_{L,(j+\Delta)}]^2$$

where i(0) is the index at which the minimum of the trajectory $\{S_1, S_2, \ldots, S_n\}$ is observed, and an average of $\{y_i\}$ within the left interval is expressed as:

$$\bar{y}_{L,(j+\Delta)} = \frac{1}{j+\Delta} \sum_{i=1}^{j+\Delta} y_{i(0)-i+1}$$

In cases where i(0) is not an integer, the module 110 may adjust the value of i(0), such as rounding, to a nearest integer.

The confidence region algorithm may continue from block 510 to block 512. In some examples, the blocks 510 and 512 may be performed in parallel or in any arbitrary order. At block 512, the module 110 may determine sample standard deviations of $\{y_i\}$ corresponding to the indices within the right interval, where each standard deviation is denoted as $\hat{\sigma}_{R,j}$, and where R indicates the standard deviations determined in block 512 corresponds to the right side from i(0). Further, the variance of $\{y_i\}$ within the right interval may be expressed as:

$$\hat{\sigma}^2_{R,j} = \frac{1}{j-1} \sum_{i=1}^{j} [y_{i(0)+1} - \bar{y}_{R,(j)}]^2$$

and an average of $\{y_i\}$ within the right interval is expressed as:

$$\bar{y}_{R,(j)} = \frac{1}{j} \sum_{i=1}^{j} y_{i(0)+i}$$

The confidence region algorithm may continue from block 510, or block 512, to block 514. At block 514, the module 110 may determine a standardized difference $d_j$ and a level of significance of $d_j$, denoted as $p_j$:

$$d_j = \frac{\bar{y}_{R,(j)} - \bar{y}_{L,(j+\Delta)}}{\sqrt{\frac{\hat{\sigma}^2_{R,j}}{j} + \frac{\hat{\sigma}^2_{L,j+\Delta}}{j+\Delta}}} \text{ and } p_j = \Phi[-d_j]$$

where $\Phi[.]$ is the cumulative distribution function (cdf) of the Standard Gaussian random variable. The value of $d_j$ may be used as a representative value of the experimental expansion value of the boundaries of the current confidence region at the current iteration (e.g., j=2). The cumulative distribution function of $d_j$ represented by $p_j$ may provide an indication of a location of the resulting confidence region. In another example, procedure constants such as fixed values of variances such as $\sigma^2_L$ and $\sigma^2_R$ may be used (instead of $\hat{\sigma}^2_{R,j}$ and $\hat{\sigma}^2_{L,j+\Delta}$) to determine $d_j$, such that values of $\{y_i\}$ that are in close proximity to the index i(0) may be considered as having a known or pre-specified variance during the execution of the confidence region algorithm. In another example, median values of $\{y_i\}$ may be used (instead of averages $\bar{y}_{R,(j)}$ and $\bar{y}_{L,(j+\Delta)}$) to determine $d_j$, where the medians may be expressed as:

$$\check{y}_{L,(j+66)} = \text{median}\{y_{i(0)-i+1}, i=1,2,\ldots,j+\Delta\}$$

$$\check{y}_{R,j} = \text{median}\{y_{i(0)+i}, i=1,2,\ldots,j\}$$

The confidence region algorithm may continue from block 514 to block 516. At block 516, the module 110 may determine whether the standardized difference $p_j$ is less than or equal to the benchmark value denoted as $\alpha^*c_f$.

If the standardized difference $p_j$ is less than or equal to a value of $a^*c_f$, the confidence region algorithm may continue from block 516 to block 522. At block 522, the module 110 may set the value of a constant J as j, and output the data (a) i(0), $x_{i(0)}$, (b) J+Δ, $\bar{y}_{L,(J+\Delta)}$, $\hat{\sigma}^2_{L,J+\Delta}$, (C) J,$\bar{y}_{R,(J)}$, $\hat{\sigma}^2_{R,J}$, and (d) $p_J$, $d_J$, IS, where IS is a success indicator indicating when the confidence region algorithm was executed successfully. The setting of the constant J as j indicates that a value of the index j, or the confidence value, is large enough to have nominal coverage of the test results surround i(0). The success indicator IS=0 may indicate that the confidence region algorithm is completed and a confidence region is identified. The value of J+Δ indicated in data (b) may indicate how far the confidence region can be expanded to the left of i(0), and the value of J indicated in data (c) may indicate how far the confidence region can be expanded to the right of i(0). The data $p_J$, $d_J$, outputted as data (d) defines a resulting confidence region from the execution of the confidence region algorithm, where $d_j$ is associated with an amount of expansion to the confidence region, and $p_j$ is associated with the location of the resulting confidence region with respect to an axis of the sequence $\{x_i\}$.

If the standardized difference $p_j$ is not less than or equal to a value of $a^*c_f$, the confidence region algorithm may continue from block 516 to block 518. At block 518, the module 110 may determine if the index j can be incremented without violating the left or right boundaries of the current test region for $\{x_i\}$.

If j can be incremented, then the confidence region algorithm may continue from block 518 to block 520. At block 520, the module 110 may increment the index j to set j=j+1. The confidence region algorithm may return from block 520 to block 508 to experiment further expansion of the confidence region (e.g., larger value of the index j). In some examples, the index j may be incremented with values other than 1.

If j cannot be incremented, then the confidence region algorithm may continue from block 518 to block 520. At block 520, the module 110 may output the data in block 522 with the success indicator IS=1 (indicating the right boundary is reached) or IS=−1 (indicating the left boundary is reached).

The confidence region algorithm in FIG. 5 may be used for a sequence $\{x_i\}$ that is monotonically increasing (e.g., performance attributes such as operating period). To execute the confidence region algorithm for a sequence $\{x_i\}$ that is monotonically decreasing (e.g., performance attributes such as temperature), the confidence region algorithm may be modified by computing $p_j=\Phi[d_j]$.

In some examples, the confidence region algorithm may be modified depending on a desired implementation of the system 100. The process shown in FIG. 5 is based on a test region for $\{x_i\}$ that is pre-defined, thus there may be limited flexibility to expand the test region. However, in some examples, the test region may be expanded in order to identify test regions with relatively high confidence score. For example, the module 110 may experimentally expand the boundaries of the test region until the minimum index i(0) is identified and/or until the confidence region algorithm terminates with the success indicator IS=0.

The module 110 may further execute a sequential version of the confidence region algorithm in parallel with the identification of i(0). By running the sequential version with the identification of i(0) in parallel, the module 110 may reduce the stress on the chip 101 caused by repeatedly conducting the test 104. To execute the sequential version of the confidence region algorithm, the module 110 may initiate an experiment by establishing a direction of search along the sequence $\{x_i\}$. For example, if an execution of the confidence region algorithm indicates that there is a need to shift the test region towards the right (e.g., need values of $x_i$ with larger indices), then the direction of search may be an increasing direction of the indices i.

As the module 110 searches along the right side (increasing direction), the module 110 may also perform the instructions 124 to determine the cumulative sum $\{S_i\}$ and identify the index i(0). If the values of $\{y_i\}$ tend to increase past an identified i(0), the module 110 may set the identified i(0) as a candidate minimum index. The module 110 may continue to execute the confidence region algorithm based on the candidate minimum index, and continue to increment the index j in the confidence region algorithm, until the confidence region algorithm terminates with the success indicator IS=0 and output the data to indicate a newly identified test region. When executing the confidence region algorithm sequentially, if the module 110 identifies a new minimum index i(0), the module 110 may set a new candidate minimum index i(0) and continue subsequent executions of the confidence region algorithm until either a stopping criterion (e.g., IS=0, or IS=1 since the search is towards the right) is satisfied or a new minimal value of $\{S_i\}$ is identified.

In some examples, the module 110 may further implement a control scheme to perform self-diagnosis on the chip 101 and to provide notifications to users on a course of action or remedial measures to be taken to optimize the lifespan of the chip 101. For example, the control scheme may include establishing a sampling frequency for a periodic monitoring (e.g., every 2 weeks) to identify different values of the parameter 140 in order to detect any significant shift away from a baseline value of the parameter 140. The module 110 may detect the significant shift and may output an indicator to notify the user of the system 100 or the chip 101 that the chip 101 may need replacement or be assigned to less exhaustive tasks. The implementation of the control scheme allows the module to detect not only changes in the values of the parameter 140, but also changes in confidence region boundaries, variances, and/or other indicators. In an example, even if no notification is produced in relation to the parameter 140, an increase in length of the confidence region boundaries could indicate presence of conditions that merit engineering attention. In summary, the system 100 provides a methodology for ongoing monitoring of deviations against various baseline values, in order to measure the degree of degradation of the chip 101 using values of the parameter 140 determined at different times, and issues recommendations and/or alerts accordingly.

The system 100 may also be implemented for two-dimensional analysis (e.g., analyzing only the operating period, or only the operating frequency, is a one-dimensional analysis). In two-dimensional analysis, a pair of parameters may be defined by the module 110, such as a first parameter for voltage and a second parameter for operating period. For example, the test 104 may be a one-dimensional test to analyze the operating period of the chip 101 at a fixed voltage of 1.1V. The module 110 may further conduct the test 104 on the chip 101 at each fixed voltage of 1.2V, 1.3V, 1.4V, 1.5V, to generate five different sets of test results, each set of test result corresponds to a same range of operating period under the test 104 and to a respective voltage. The module 110 may merge the test results to generate a combined test result that may be represented by a shmoo plot. In another example, the module 110 may conduct tests on the chip 101 using a column-by-column embodiment (e.g., keeping the operating period fixed and decreasing the voltage) instead of row-by-row embodiment (e.g., keeping the voltage fixed and increasing the operating period). In some examples, the attribute parameter determined from the row-by-row embodiment may not coincide with the attribute parameter determined from the column-by-column embodiment due to a presence of serial correlation between measurements within a row and measurements within a column. In some examples, the serial correlations between the rows and columns may produce various data patterns that may be used by the module 110 to analyze the determined values of the attribute parameters.

In an example, a baseline value may be determined for each row of test results among the two-dimensional analysis. The module 110 may also determine an adjusted two-dimensional baseline based on post-processing of the test results associated with the baseline values of each row of test data (or each set of test data). The adjusted two-dimensional baseline may be determined by taking into account not only the experiments for a specific row, but also test results from other rows (generally, rows located in the neighborhood of the given row will have most influence on adjustments). For example, the module 110 may apply a curve smoothing technique on the average minima $x_{i(0)}$ of each row (1.1V, 1.2V, . . . , 1.5V), such as cubic splines, kernel smoothers or similar techniques in the field of nonparametric regression, to determine the adjusted two-dimensional baseline value. The adjusted two-dimensional baseline may be used by the module 110 to analyze correlations between different rows of test results. Analysis of the adjusted two-dimensional baseline value may provide a granular analysis, such as observing how different voltages affect the operating period of a chip that may be degrading. A detection speed of degradation of the chip may also be improved because if the values of an attribute parameter determined from a particular row indicates degradation, the module 110 may not need to perform further analysis on other rows and may determine remedial measures immediately.

In some examples, the system 100 may also be implemented for multi-dimensional analysis (more than two dimensions), such as voltage, operating period, and current. The module 110 may conduct a test to determine an attribute parameter associated with operating period while maintaining the remaining variables of voltage and current at fixed levels. An adjusted multi-dimensional baseline can be computed based on principle of the determination of the adjusted two-dimensional baseline value, but the smoothing techniques may more complex due to a need to use multi-dimensional splines or multi-dimensional kernel smoothers.

Figure 6:
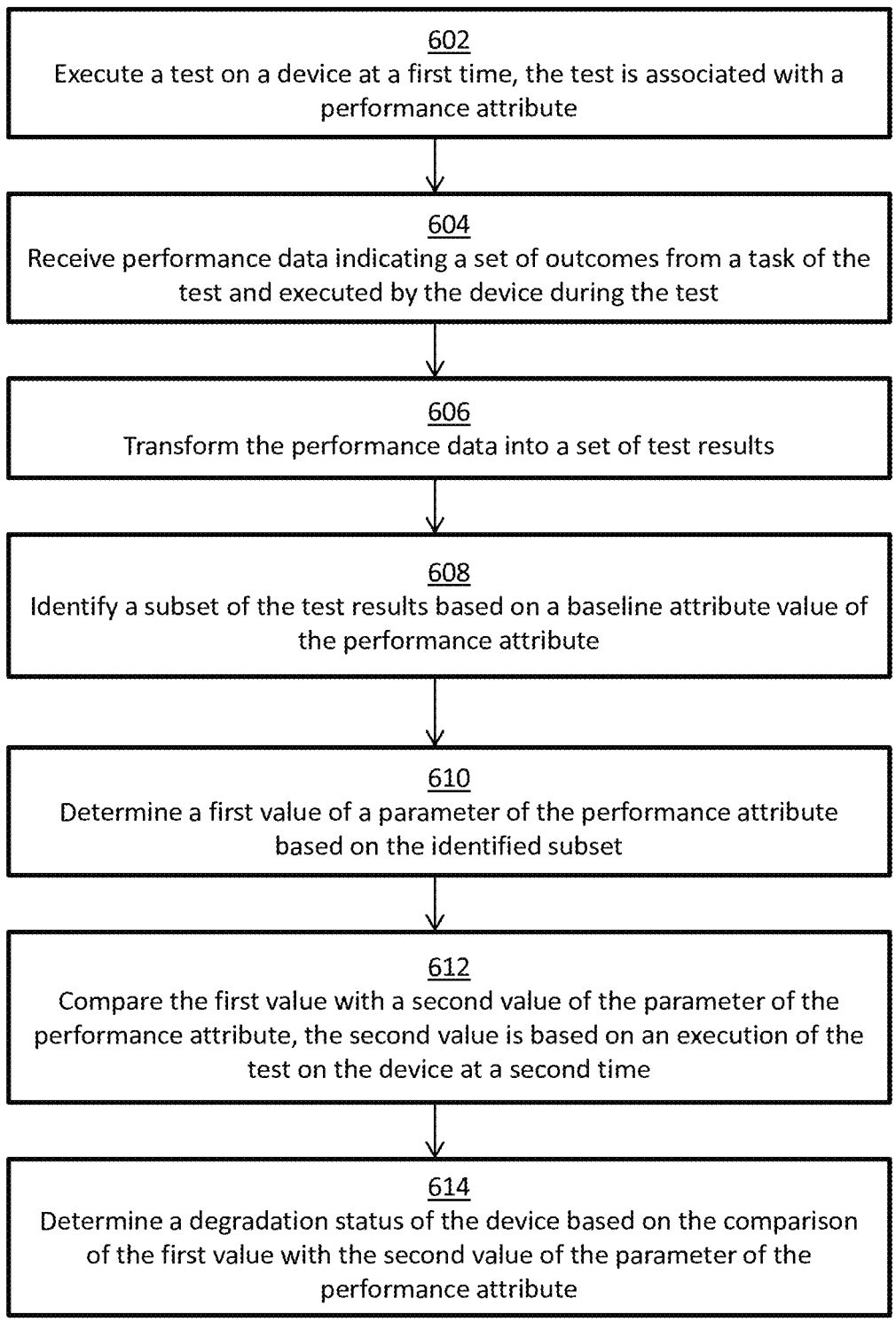
FIG. 6 illustrates a flow diagram relating to a process, in one embodiment, to implement detection of performance degradation in integrated circuits.

FIG. 6 illustrates a flow diagram relating to a process, in one embodiment, to implement detection of performance degradation in integrated circuits, arranged in accordance with at least some embodiments presented herein. The process in FIG. 6 may be implemented using, for example, computer system 100 discussed above. An example process may include one or more operations, actions, or functions as illustrated by one or more of blocks 602, 604, 606, 608, 610, 612, and/or 614. Although illustrated as discrete blocks, various blocks may be divided into additional blocks, combined into fewer blocks, eliminated, or performed in parallel, depending on the desired implementation.

Processing may begin at block 602, where a processor executes a test on a device at a first time. The test includes executable instructions for the device to execute a task under at least one specific condition, and the at least one specific condition includes a range of attribute values of a performance attribute. The device may be a semiconductor chip. The processor may execute the test on the device periodically. Processing may continue from block 602 to block 604. At block 604, the processor receives performance data indicating a set of outcomes from the task executed by the device during the test. Each outcome corresponds to an attribute value of the performance attribute. Processing may continue from block 604 to block 606. At block 606, the processor transforms the performance data into a set of test results. The transformation includes classifying each piece of performance data into a first type of test result or a second type of test result.

Processing may continue from block 606 to block 608. At block 608, the processor identifies a subset of the test results based on a baseline attribute value. For example, the processor is configured to apply a confidence region algorithm on the baseline attribute value to identify a confidence region within the set of test results, where the confidence region is the subset. In an example, a first type of test result is a failed test result, and a second type of test result is a successful test result, such that the subset of test results spans from a last failed result prior to a first successful result to a first successful result subsequent to a last failed result among the set of test results.

Processing may continue from block 608 to block 610. At block 610, the processor determines a first value of a parameter of the performance attribute of the device based on the identified subset. To determine the first value, the processor quantifies the set of test results to generate quantified data. Then, the processor identifies a switch-over level among the quantified data. Then, the processor determines a set of deviations, each deviation is a deviation of a corresponding piece of quantified data from the switch-over level. Then, the processor determines a cumulative sum of the set of deviations. Then, the processor identifies a minimum of the cumulative sum. Then, the processor sets an attribute value that corresponds to the minimum of the cumulative sum as the first value of the parameter.

Processing may continue from block 610 to block 612. At block 612, the processor compares the first value with a second value of the performance attribute. The second value is determined based on an execution of the test on the device at a second time. Processing may continue from block 612 to block 614. At block 614, the processor determines a degradation status of the device based on the comparison of the first value with the second value of the performance attribute. In response to the degradation status indicating a rate of degradation exceeding a threshold, the processor removes an assignment of the task from the device and/or assigns a different task to the device.

Figure 7:
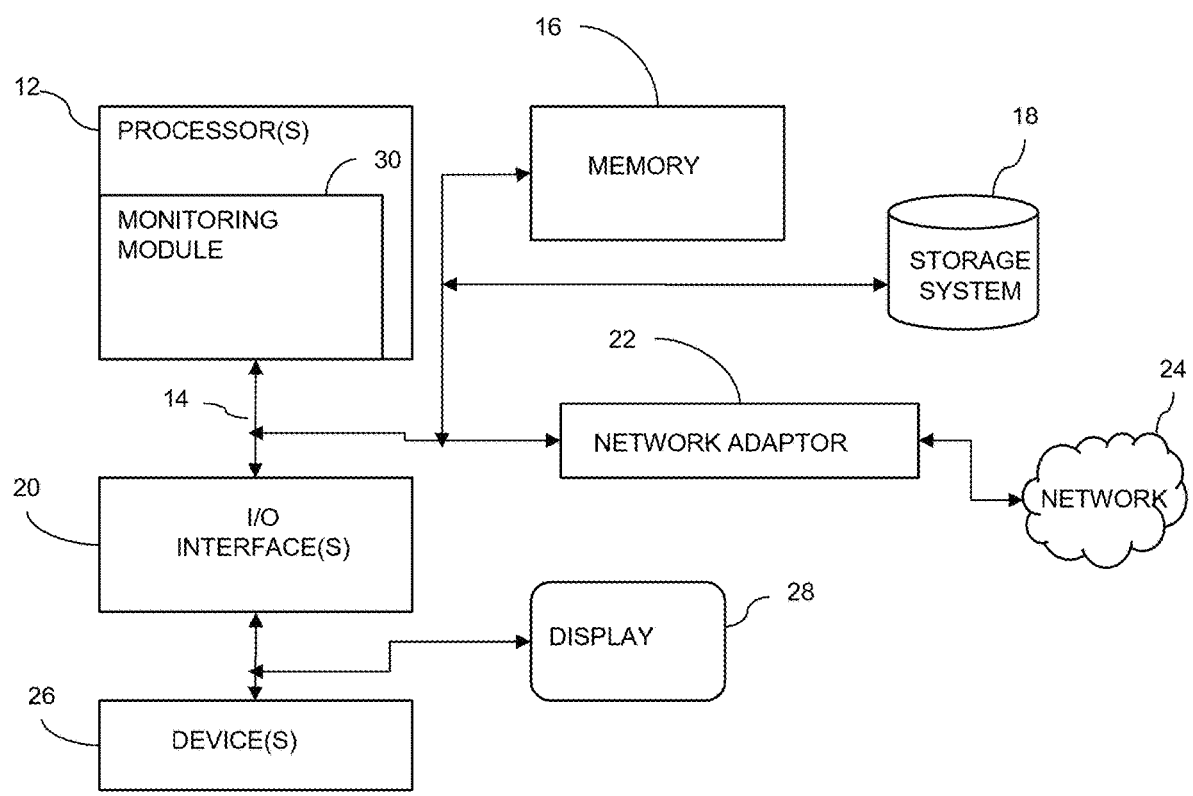
FIG. 7 illustrates a schematic of an example computer or processing system that may implement detection of performance degradation in integrated circuits in one embodiment.

FIG. 7 illustrates a schematic of an example computer or processing system that may implement detection of performance degradation in integrated circuits in one embodiment of the present disclosure. The computer system is only one example of a suitable processing system and is not intended to suggest any limitation as to the scope of use or functionality of embodiments of the methodology described herein. The processing system shown may be operational with numerous other general purpose or special purpose computing system environments or configurations. Examples of well-known computing systems, environments, and/or configurations that may be suitable for use with the processing system shown in FIG. 7 may include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, supercomputers, and distributed cloud computing environments that include any of the above systems or devices, and the like.

The computer system may be described in the general context of computer system executable instructions, such as program modules, being executed by a computer system. Generally, program modules may include routines, programs, objects, components, logic, data structures, and so on that perform particular tasks or implement particular abstract data types. The computer system may be practiced in distributed cloud computing environments where tasks are performed by remote processing devices that are linked through a communications network. In a distributed cloud computing environment, program modules may be located in both local and remote computer system storage media including memory storage devices.

The components of computer system may include, but are not limited to, one or more processors or processing units 12, a system memory 16, and a bus 14 that couples various system components including system memory 16 to processor 12. The processor 12 may include a module 30 (e.g., monitoring module 30) that performs the methods described herein. The module 30 may be programmed into the integrated circuits of the processor 12, or loaded from memory 16, storage device 18, or network 24 or combinations thereof.

Bus 14 may represent one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system may include a variety of computer system readable media. Such media may be any available media that is accessible by computer system, and it may include both volatile and non-volatile media, removable and non-removable media.

System memory 16 can include computer system readable media in the form of volatile memory, such as random access memory (RAM) and/or cache memory or others. Computer system may further include other removable/non-removable, volatile/non-volatile computer system storage media. By way of example only, storage system 18 can be provided for reading from and writing to a non-removable, non-volatile magnetic media (e.g., a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 14 by one or more data media interfaces.

Computer system may also communicate with one or more external devices 26 such as a keyboard, a pointing device, a display 28, etc.; one or more devices that enable a user to interact with computer system; and/or any devices (e.g., network card, modem, etc.) that enable computer system to communicate with one or more other computing devices. Such communication can occur via Input/Output (I/O) interfaces 20.

Still yet, computer system can communicate with one or more networks 24 such as a local area network (LAN), a general wide area network (WAN), and/or a public network (e.g., the Internet) via network adapter 22. As depicted, network adapter 22 communicates with the other components of computer system via bus 14. It should be understood that although not shown, other hardware and/or software components could be used in conjunction with computer system. Examples include, but are not limited to: microcode, device drivers, redundant processing units, external disk drive arrays, RAID systems, tape drives, and data archival storage systems, etc.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A computer-implemented method comprising:
   executing a test on a device at a first time, wherein the test comprises executable instructions for the device to execute a task under at least one specific condition, and the at least one specific condition comprises a range of attribute values of a performance attribute;
   receiving performance data indicating a set of outcomes from the task executed by the device during the test, each outcome corresponds to an attribute value of the performance attribute;
   transforming the performance data into a set of test results;
   identifying a subset of the test results based on a baseline attribute value;
   determining a first value of a parameter of the performance attribute of the device based on the identified subset;
   comparing the first value with a second value of the parameter of the performance attribute, wherein the second value is based on an execution of the test on the device at a second time; and
   determining a degradation status of the device based on the comparison of the first value with the second value of the parameter of the performance attribute.

2. The computer-implemented method of claim 1, wherein the test is executed on the device periodically.

3. The computer-implemented method of claim 1, wherein a first type of test result is a failed test result, and a second type of test result is a successful test result, and wherein the subset of test results spans from a last failed result prior to a first successful result to a first successful result subsequent to a last failed result among the set of test results.

4. The computer-implemented method of claim 1, wherein transforming the performance data into the set of test results comprises classifying each piece of performance data into a first type of test result or a second type of test result.

5. The computer-implemented method of claim 1, wherein determining the first value of the parameter of the performance attribute comprises:
   quantifying the set of test results to generate quantified data;
   identifying a switch-over level among the quantified data;
   determining a set of deviations, each deviation is a deviation of a corresponding piece of quantified data from the switch-over level;
   determining a cumulative sum of the set of deviations;
   identifying a minimum of the cumulative sum; and
   setting an attribute value that corresponds to the minimum of the cumulative sum as the first value of the parameter of the performance attribute.

6. The computer-implemented method of claim 1, further comprising, in response to the degradation status indicating a rate of degradation exceeding a threshold, performing at least one of:
   removing an assignment of the task from the device; and
   assigning a different task to the device.

7. The computer-implemented method of claim 1, wherein in response to the degradation status indicating a rate of degradation exceeding a threshold, the method further comprising outputting a recommendation to:
   remove an assignment of the task from the device;
   assign a different task to the device; and
   replace the device with a new device.

8. The computer-implemented method of claim 1, wherein identifying the subset comprises applying a confidence region algorithm on the baseline attribute value to identify a confidence region within the set of test results, the confidence region being the subset of test results.

9. A system comprising:
a memory device;
a hardware processor configured to be in communication with the memory device, the hardware processor being configured to:
execute a test on a device at a first time, wherein the test comprises executable instructions for the device to execute a task under at least one specific condition, and the at least one specific condition comprises a range of attribute values of a performance attribute;
receive performance data indicating a set of outcomes from the task executed by the device during the test, each outcome corresponds to an attribute value of the performance attribute;
transform the performance data into a set of test results;
identify a subset of the test results based on a baseline attribute value;
determine a first value of a parameter of the performance attribute of the device based on the identified subset;
compare the first value with a second value of the parameter of the performance attribute, wherein the second value is based on an execution of the test on the device at a second time; and
determine a degradation status of the device based on the comparison of the first value with the second value of the parameter of the performance attribute.

10. The system of claim 9, wherein the processor is further configured to execute the test on the device periodically.

11. The system of claim 9, wherein a first type of test result is a failed test result, and a second type of test result is a successful test result, and wherein the subset of test results spans from a last failed result prior to a first successful result to a first successful result subsequent to a last failed result among the set of test results.

12. The system of claim 9, wherein the processor is further configured to:
quantify the set of test results to generate quantified data;
identify a switch-over level among the quantified data;
determine a set of deviations, each deviation is a deviation of a corresponding piece of quantified data from the switch-over level;
determine a cumulative sum of the set of deviations;
identify a minimum of the cumulative sum; and
set an attribute value that corresponds to the minimum of the cumulative sum as the first value of the parameter of the performance attribute.

13. The system of claim 9, wherein the processor is further configured to, in response to the degradation status indicating a rate of degradation that exceeds a threshold:
remove an assignment of the task from the device; and
assign a different task to the device.

14. The system of claim 9, wherein identification of the subset comprises an application of a confidence region algorithm on the baseline attribute value to identify a confidence region within the set of test results, the confidence region being the subset of test results.

15. A computer program product of component degradation detection, the computer program product comprising a computer readable storage medium having program instructions embodied therewith, the program instructions executable by a processing element of a device to cause the device to:
execute a test on a component of the device at a first time, wherein the test comprises executable instructions for the component to execute a task under at least one specific condition, and the at least one specific condition comprises a range of attribute values of a performance attribute;
receive performance data indicating a set of outcomes from the task executed by the component during the test, each outcome corresponds to an attribute value of the performance attribute;
transform the performance data into a set of test results;
identify a subset of the test results based on a baseline attribute value;
determine a first value of a parameter of the performance attribute based on the identified subset;
compare the first value with a second value of the parameter of the performance attribute, wherein the second value is based on an execution of the test on the device at a second time; and
determine a degradation status of the device based on the comparison of the first value with the second value of the parameter of the performance attribute.

16. The computer program product of claim 15, wherein the program instructions are further executable by the processing element of the device to cause the device to execute the test on the component periodically.

17. The computer program product of claim 15, wherein a first type of test result is a failed test result, and a second type of test result is a successful test result, and wherein the subset of test results spans from a last failed result prior to a first successful result to a first successful result subsequent to a last failed result among the set of test results.

18. The computer program product of claim 15, wherein the program instructions are further executable by the processing element of the device to cause the device to:
quantify the set of test results to generate quantified data;
identify a switch-over level among the quantified data;
determine a set of deviations, each deviation is a deviation of a corresponding piece of quantified data from the switch-over level;
determine a cumulative sum of the set of deviations;
identify a minimum of the cumulative sum; and
set an attribute value that corresponds to the minimum of the cumulative sum as the first value of the parameter of the performance attribute.

19. The computer program product of claim 15, wherein the program instructions are further executable by the processing element of the device to cause the device to, in response to the degradation status indicating a rate of degradation that exceeds a threshold:
remove an assignment of the task from the component; and
assign a different task to the component.

20. The computer program product of claim 15, wherein the identification of the subset comprises an application of a confidence region algorithm on the baseline attribute value to identify a confidence region within the set of test results, the confidence region being the subset of test results.

* * * * *